(12) United States Patent
Shibahara (10) Patent No.: US 7,253,485 B2
(45) Date of Patent: Aug. 7, 2007

(54) SEMICONDUCTOR DEVICE AND MANUFACTURING METHOD THEREOF

(75) Inventor: Kentaro Shibahara, Higashihiroshima (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 184 days.

(21) Appl. No.: 10/926,711

(22) Filed: Aug. 25, 2004

(65) Prior Publication Data

US 2005/0048725 A1    Mar. 3, 2005

(30) Foreign Application Priority Data

Sep. 3, 2003    (JP) ............................. 2003-311387

(51) Int. Cl.
*H01L 29/78* (2006.01)
*H01L 29/43* (2006.01)

(52) U.S. Cl. ................................. 257/407; 257/E29.16

(58) Field of Classification Search ................ 257/486, 257/751, E29.158, E29.16, 407, 391, 392, 257/763, E21.637, E21.159, 764; 438/275, 438/685

See application file for complete search history.

(56) References Cited

U.S. PATENT DOCUMENTS

| | | | | |
|---|---|---|---|---|
| 6,027,961 A * | 2/2000 | Maiti et al. | ................. | 438/199 |
| 6,291,282 B1 * | 9/2001 | Wilk et al. | ................. | 438/203 |
| 6,483,151 B2 * | 11/2002 | Wakabayashi et al. | ...... | 257/369 |
| 6,660,577 B2 * | 12/2003 | Chen et al. | ................. | 438/199 |
| 6,815,285 B2 * | 11/2004 | Choi et al. | ................. | 438/231 |

FOREIGN PATENT DOCUMENTS

| | | |
|---|---|---|
| JP | 2000-031296 A | 1/2000 |
| WO | WO 02/058122 A1 | 7/2002 |
| WO | WO 02/073696 A1 | 9/2002 |

OTHER PUBLICATIONS

Lander, R.J.P., et al., "Control of a Metal-Electrode Work Function by Solid-State Diffusion of Nitrogen," Materials Research Society Symposium Proceedings 716:B5.11.1-B5.11.62002, San Francisco, Calif., Apr. 2000.

(Continued)

*Primary Examiner*—Matthew C. Landau
(74) *Attorney, Agent, or Firm*—Christensen O'Connor Johnson Kindness PLLC (57) ABSTRACT

A manufacturing method for a CMOS semiconductor device in which gate electrodes are adjusted to have different work function values comprises forming an device region of a first and second conductivity type for forming first and second MOS semiconductor element devices, respectively, in a semiconductor substrate, forming a gate insulator, forming a laminated film comprising a molybdenum film and nitrogen containing film for doping nitrogen into molybdenum, doping nitrogen from the nitrogen containing film into molybdenum, processing the laminated film into gate electrodes of the first and second MOS semiconductor element devices, removing the nitrogen containing film from the gate electrodes of the second MOS semiconductor element device and covering the gate electrode of the first MOS semiconductor element devices with a nitrogen diffusion preventing film, and reducing the nitrogen concentration in molybdenum of the gate electrodes of the second MOS semiconductor element device.

2 Claims, 6 Drawing Sheets

OTHER PUBLICATIONS

Lu, Q., et al., "Dual-Metal Gate Technology for Deep-Submicron CMOS Transistors," Symposium on VLSI Technology Digest of Technical Papers, Honolulu, Hawaii, Jun. 2000, pp. 72-73.

Ranade, P., et al., "Molybdenum as a Gate Electrode for Deep Sub-Micron CMOS Technology," Materials Research Society Symposium Proceedings 611:C3.2.1-C3.2.6, San Francisco, Calif., Apr. 2000.

Hino, M., et al., "Influence of Nitrogen Profile on Mo Workfunction," *Technical Report of The Institute of Electronics, Information and Communication Engineers 103* (148) (SDM2003-50-61):49-52, Jun. 26, 2003.

\* cited by examiner

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2003-311387, filed Sep. 3, 2003, the entire contents of which are incorporated herein by reference.

BACKGROUND OF THE INVENTION

1. Field of the Invention

The invention relates to a MOS semiconductor device and a manufacturing method thereof, more particularly, to a MOS semiconductor device in which work functions of gate electrodes are adjusted to different values for MOS transistors having different conductivity types in a dual-gate structure using a metal as a gate electrode and a manufacturing method thereof.

2. Description of the Related Art

In a miniaturized CMOS semiconductor device, it is general to use a so-called dual-gate structure. In the dual-gate structure, a polysilicon highly doped with an n-type impurity (dopant) (hereinafter referred to as $n^+$ polysilicon), for example, phosphorus, is used to a gate electrode in an n-type MOS semiconductor device. Further, a polysilicon highly doped with a p-type dopant (hereinafter referred to as $p^+$ polysilicon), for example, boron, is used to a gate electrode in a p-type MOS semiconductor device. This is based on characteristics that the work function of polysilicon can be controlled by type and amount of dopant. In a designing of a surface-channel-type MOS semiconductor device, the dual-gate structure using polysilicon is widely used to attain an acceptable trade-off relationship with respect to major design factors such as the thickness of gate insulators and the substrate doping concentration.

However, the influence of the depletion layer formed in the polysilicon gate electrode has caused a more serious problem as devices have become further miniaturized in recent years. As described above, since the polysilicon electrode is doped with dopant with a high impurity concentration, the depletion layer in the polysilicon is extremely thin. However, in a next-generation device, in which the gate insulator thickness is as thin as 2 nm or less in equivalent thickness of a silicon oxide film ($SiO_2$), the depletion layer causes an increase in the capacitance corresponding to several 10% or more of the effective gate insulator thickness. Further, enhancement of the performance by a reduction in the gate insulator thickness may be hindered.

In order to avoid the above problems, studies have been conducted to use metals as the gate electrodes. The metal used to a gate electrode is required to match the MOS semiconductor device manufacturing process. For example, it is required the following characteristics to be attained: a metal film can be easily deposited; an etching process can be easily performed to form gate electrodes; an etching selectivity to the gate insulator is high; and the gate electrode is thermally stable against the gate insulator in heat treatments after forming the gate electrode. Since the work functions of the metals are different depending on respective materials and have distributed widely, it is possible to form gate electrodes having work functions equivalent to those of $n^+$ and $p^+$ polysilicon by selecting two kinds of adequate metals. For example, the use of titanium (Ti) to a gate electrode of an n-type MOS semiconductor device and of molybdenum (Mo) to a gate electrode of a p-type MOS semiconductor device has been reported by Q. Lu et al. in "2000 Symposium on VLSI Technology Digest of Technical Papers", pp. 72-73. However, when this technique is applied to a CMOS semiconductor device production in practice, the manufacturing process becomes too complicated and is not suitable for mass production.

It has been observed that Mo is thermally stable in the heat treatment usually employed in the latest manufacturing process of a MOS semiconductor device even when Mo is formed on an insulator, such as $SiO_2$ film, silicon nitride film (SiN) and hafnium oxide film ($HfO_2$), which is used or may be used as a gate insulator. Therefore, Mo is expected to be used as a gate electrode material of future CMOS semiconductor devices. Further, a technique for implanting nitrogen ions into Mo to adjust the work function is reported by P. Ranade et al. in Mat. Res. Soc. Symp., Vol. 611, 2000, pp. C3.2.1-C3.2.6. However, it has been pointed out problems by the inventors and others based on their studies. That is, this method is not practical because of problems that the gate insulator and an interface between the gate electrode and the gate insulator are damaged in the implantation.

As another method for adjusting the work function of the Mo gate electrode, a method for thermally diffusing nitrogen from a titanium nitride (TiN) film deposited on Mo to underlying Mo has been reported by R. J. P. Lander et al. in Mat. Res. Soc. Symp. Proc. Vol. 716, 2002, pp. B5.11.1-B5.11.6. However, no study of a method for applying the technique to a CMOS semiconductor device with gate electrodes adjusting to have different work function values on the same semiconductor substrate has been reported.

Therefore, in order to realize a miniaturized CMOS semiconductor device, such as a device having a feature size of the 65 nm or less and having gate electrodes whose work functions are adjusted to different respective values, the following criteria must be met: (a) the gate electrodes of MOS semiconductor devices of different electrical conductivity types must be adjusted to have different work function values, respectively, (b) no depletion layer can be formed in the gate electrode in the operation of the MOS semiconductor device, (c) the manufacturing process must be simple and practicable, and (d) side effects must not occur in a MOS semiconductor device and/or a semiconductor manufacturing process, for example, damage to the gate insulator must be negligible.

BRIEF SUMMARY OF THE INVENTION

The above criteria are satisfactorily met in the semiconductor device and manufacturing method thereof disclosed herein.

According to an aspect of the invention, a MOS semiconductor device manufacturing method comprises forming an device region of a first conductivity type for forming first MOS semiconductor element devices and a device region of a second conductivity type for forming second MOS semiconductor element devices in a semiconductor substrate, forming a gate insulator, forming a laminated film comprising a molybdenum film and a nitrogen containing film which is to be used to dope nitrogen into the molybdenum film, doping nitrogen from the nitrogen containing film into the molybdenum film, processing the laminated film into gate electrodes of the first and second MOS semiconductor element devices, removing the nitrogen containing film from the gate electrodes of the second MOS semiconductor element device and covering the gate electrode of the first MOS semiconductor element devices with a nitrogen diffusion preventing film, and reducing the nitrogen concentration in the molybdenum film of the gate electrodes of the second MOS semiconductor element device.

In another aspect of the invention, a MOS semiconductor device manufacturing method comprises forming an device region of a first conductivity type for forming first MOS semiconductor element devices and an device region of a second conductivity type for forming second MOS semiconductor element devices in a semiconductor substrate, sequentially forming a gate insulator and a molybdenum film, processing the molybdenum film into gate electrodes of the first and second MOS semiconductor element devices, forming a nitrogen containing film which is to be used to dope nitrogen into the molybdenum film of the gate electrodes, doping nitrogen into the molybdenum film from the nitrogen containing film, removing the nitrogen containing film from the gate electrodes of the second MOS semiconductor element devices and covering the gate electrodes of the first MOS semiconductor element devices with a nitrogen diffusion preventing film, and reducing the nitrogen concentration in the molybdenum film of the gate electrodes of the second MOS semiconductor element devices.

In still another aspect of the invention, a MOS semiconductor device manufacturing method comprises forming an device region of a first conductivity type for forming first MOS semiconductor element devices and a device region of a second conductivity type for forming second MOS semiconductor element devices on a semiconductor substrate, sequentially forming a gate insulator and a molybdenum film, processing the molybdenum film into gate electrodes of the first and second MOS semiconductor element devices, forming a nitrogen containing film which is to be used to dope nitrogen into the molybdenum film of the gate electrodes, removing the nitrogen containing film on the gate electrodes of the second MOS semiconductor element devices, and doping nitrogen from the nitrogen containing film into the molybdenum film of the gate electrodes of the first MOS semiconductor element devices.

In a further another aspect of the invention, a MOS semiconductor device comprises first and second MOS semiconductor element devices, wherein each of the first and second MOS semiconductor element devices having a gate electrode which include a molybdenum film, the molybdenum films in the gate electrode of each of the first and second MOS semiconductor element devices contains different nitrogen concentrations, and work function of the gate electrode of each of the first and second MOS semiconductor element devices is adjusted to different values.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

DETAILED DESCRIPTION OF THE INVENTION

In order to realize a miniaturized CMOS semiconductor device, such as a device having a feature size of the 65 nm or less and having gate electrodes whose work functions are adjusted to different respective values, the following criteria must be met: (a) the gate electrodes of MOS semiconductor devices of different electrical conductivity types must be adjusted to have different work function values, respectively, (b) no depletion layer may be formed in the gate electrode in the operation of the MOS semiconductor device, (c) the manufacturing process must be simple and practicable, and (d) side effects must not occur in a MOS semiconductor device and/or a semiconductor manufacturing process, for example, damage to the gate insulator must be negligible.

The invention provides a MOS semiconductor device comprising gate electrodes which are suitable for a miniaturized MOS semiconductor device, such as a MOS semiconductor device having a feature size of the 65 nm or less and a manufacturing method thereof. The features of the gate electrodes are that the gate electrodes of the MOS semiconductor devices with electrically different conductivity types have work functions of different values, respectively, no depletion layer may be formed within the gate electrode in the operation of the MOS semiconductor device, the manufacturing process is simple and practicable, and no side effect occur in a MOS semiconductor device and a semiconductor manufacturing process, for example, damage to a gate insulator is negligible.

In the invention, the work functions of the gate electrodes are adjusted by controlling nitrogen concentrations in the molybdenum gate electrodes by use of a magnificent method. First of all, the feature of the manufacturing method of the MOS semiconductor device according to the invention is outlined with referring to FIGS. 2 to 5.

Figure 2:
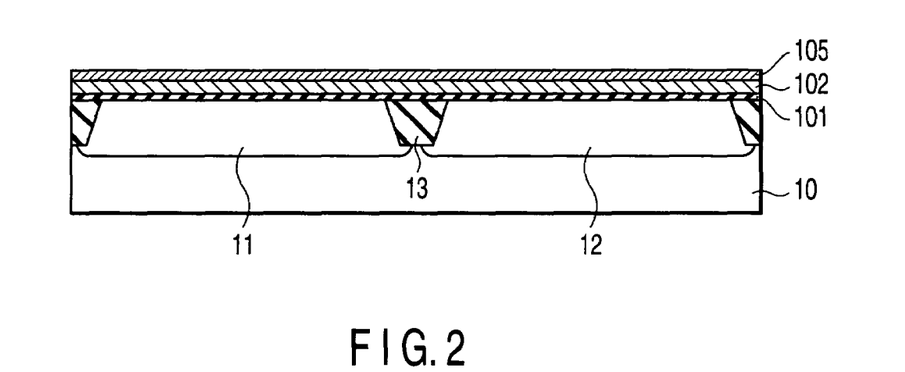
FIG. 2 is a cross sectional view for explaining an example of the MOS semiconductor device manufacturing process according to the first embodiment following FIG. 1.

An isolation 13, for example, a shallow trench isolation (STI), is formed in a silicon substrate 10. Then, a first semiconductor device region 11 (for example, p-type well) for forming a first semiconductor device 11n (for example, n-type MOS semiconductor device) and a second semiconductor device region 12 (for example, n-type well) for forming a second semiconductor devices 12p (for example, p-type MOS semiconductor devices) are formed. Next, a gate insulator 101 is formed. Then a gate electrode material, for example, a molybdenum (Mo) film 102, and a titanium nitride (TiN) film 105 to be used to diffuse nitrogen into the Mo film 103, for example, are sequentially deposited on the gate insulator 101. After that, an annealing is performed to diffuse nitrogen through solid phase diffusion into the entire Mo film 103.

Figure 3:
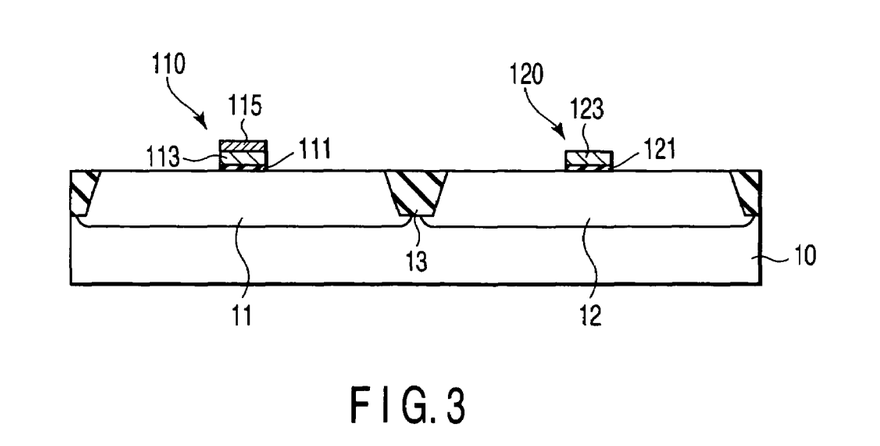
FIG. 3 is a cross sectional view for explaining an example of the MOS semiconductor device manufacturing process according to the first embodiment following FIG. 2.

Then, gate electrodes 110, 120 are patterned, and the TiN film 105 formed on one gate electrode 120 (corresponding to the second semiconductor device 12p (e.g., p-type MOS semiconductor device)) is removed, while on side surfaces of another gate electrode 110 (corresponding to the first semiconductor device 11n (e.g., n-type MOS semiconductor devices)), a film 118 preventing out-diffusion of nitrogen is formed. Next, ion implantations and an annealing are performed to form sources/drains 117, 127.

Figure 4:
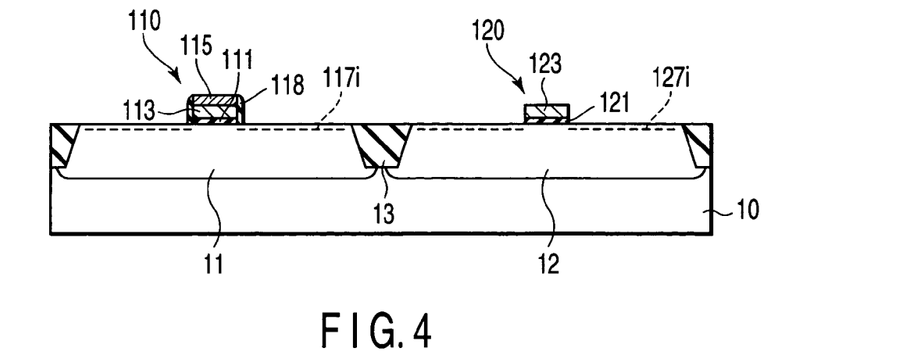
FIG. 4 is a cross sectional view for explaining an example of the MOS semiconductor device manufacturing process according to the first embodiment following FIG. 3.

In the annealing, in one Mo gate electrode 120 (corresponding to the second semiconductor device, for example) from which the TiN film 105 on the surface is removed, nitrogen is out-diffused from the upper and side surfaces of the gate electrode 120 and the nitrogen concentration in the Mo film 124 is reduced. In the other gate electrode 110 (corresponding to the first semiconductor device 11n, for example), the nitrogen concentration in the Mo film 113 is remained high since the upper surface of the Mo gate electrode 110 is covered with the TiN film 115 and the side surfaces are covered with out-diffusion preventing films 118. After that, processes required for forming the MOS semiconductor device, for example, forming a multilevel wiring, is performed to complete the MOS semiconductor device.

Figure 5:
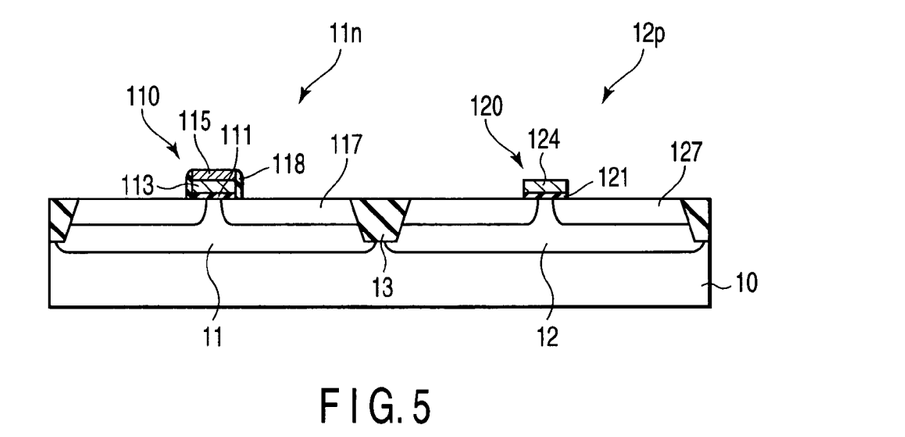
FIG. 5 is a cross sectional view for explaining an example of the MOS semiconductor device manufacturing process according to the first embodiment following FIG. 4.

Thus, the nitrogen concentrations in the Mo gate electrodes 113, 124 in the n-type and p-type MOS semiconductor devices 11n, 12p can be adjusted to predetermined values according to the method of the invention. That is, a CMOS semiconductor device in which the work functions of the gate electrodes in the n-type and p-type MOS semiconductor device are controlled in different respective values can be manufactured.

Various embodiments of the invention are explained in detail below with reference to the accompanying drawings.

FIRST EMBODIMENT

A first embodiment relates to a manufacturing method for a CMOS semiconductor device with a basic structure, that is a method for doping nitrogen into an entire Mo film used to gate electrodes before patterning the gate electrodes and then out-diffusing nitrogen from the gate electrodes of only one type to reduce the nitrogen concentration.

FIGS. 1 to 5 are cross sectional views showing a manufacturing method for a MOS semiconductor device according to the first embodiment of the invention.

Figure 1:
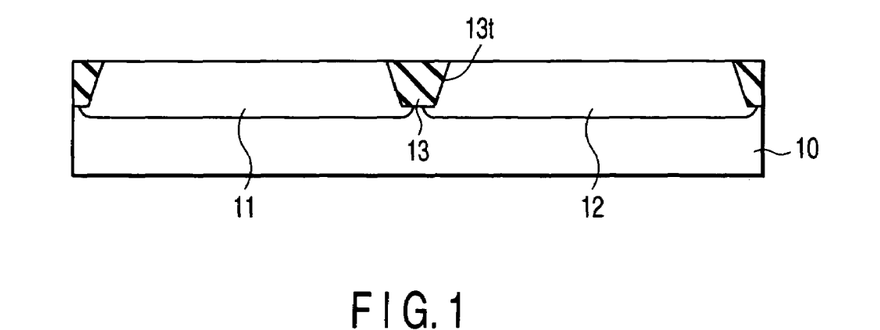
FIG. 1 is a cross sectional view for explaining an example of a MOS semiconductor device manufacturing process according to a first embodiment of the present invention.

First, as shown in FIG. 1, a first conductivity type, for example, p-type, semiconductor device region 11 and a second conductivity type, for example, n-type, semiconductor device region 12, and an isolation 13 for isolating adjacent semiconductor devices from each other are formed in a silicon substrate 10. As the silicon substrate 10, a p-type substrate is used in many cases, but an n-type substrate can also be used. In this case, the manufacturing process is basically the same except for adequately adjusting types and doses of ions in the implantations, as required.

A process for forming the isolation 13 and first and second semiconductor device regions 11, 12 is simply explained below. Since the structure shown in FIG. 1 can be formed by a conventional technique, thus the process for forming the structure is not shown in the drawing.

A silicon thermal oxide ($SiO_2$) film and a silicon nitride (SiN) film by, for example, CVD are formed on the silicon substrate 10. Then, an isolation 13 is formed to isolate adjacently formed semiconductor devices electrically to each other. A region other than the isolation 13 to be formed is covered with a resist film. The SiN film and $SiO_2$ film are removed by anisotropic dry etching with the resist as a mask. Further, the surface of the silicon substrate 10 is etched to form a shallow trench 13t (outline is shown in FIG. 1) for the isolation. A thick insulation film, for example, an $SiO_2$ film by CVD is deposited on an entire substrate 10. The isolation trench 13t is completely filled with the CVD $SiO_2$ film. As a filling insulation film, an $SiO_2$ film formed by CVD or thermal oxidation, an SiN film formed by CVD or a combination of the above films can be used. Next, the surface is planarized by chemical-mechanical polishing (CMP). In this case, the SiN film acts as a stopper for the CMP, and the insulation film, for example, $SiO_2$ film deposited higher than the SiN film is removed. Thus, an isolation 13 with the structure called a shallow trench isolation (STI) is formed. It is preferable to form an isolation 13 with an STI structure, however another structure, such as an LOCOS or the like, can be employed.

Next, a region other than a region being formed the first semiconductor device region 11 is covered with a resist film (not shown). Then, the first conductivity type dopant of p-type, for example, boron (B) is implanted at a high energy into the region being formed the first semiconductor device region 11 using the resist film as a mask. Likewise, the second conductivity type dopant of n-type, for example, phosphorus (P) is implanted into a region being formed the second semiconductor device region 12. After that, an annealing is performed to electrically activate the implanted dopant and recover damage caused by the implantation. Each of the first and second semiconductor device regions 11, 12 is generally called a well. Next, the SiN and $SiO_2$ films initially formed on the silicon substrate 10 are removed by etching, for example. Thus, a structure having a first and second semiconductor device regions 11, 12 isolated by an isolation 13 is formed as shown in FIG. 1.

Then, as shown in FIG. 2, a gate insulator 101, an Mo film 102 for forming gate electrodes, and a TiN film 105 used to diffuse nitrogen into the Mo film are sequentially formed on an entire surface of the silicon substrate 10. In this embodiment, a silicon thermal oxide film with a thickness of 2 nm is used as the gate insulator 101, an Mo film 102 with a thickness of 50 nm formed by the sputtering is used and a TiN film 105 with a thickness of 30 nm formed by the reactive sputtering is used. The film formation methods and film thickness are not limited to above. As the gate insulator 101, an insulator such as a thermal $SiO_2$ film, an SiN film formed by CVD, for example, or a silicon oxy-nitride (SiON) film formed by thermally oxidizing a CVD-SiN film or another insulator having a dielectric constant larger than that of the $SiO_2$ film may be used. The Mo film 102 may be formed by sputtering or CVD. The TiN film 105 may be formed by reactive sputtering or CVD. As the film 105 for diffusing nitrogen into the Mo film 102, a metal nitride film such as a tantalum nitride (TaN) film or tungsten nitride (WN) film may be used in addition to the TiN film. When nitrogen is doped into the Mo film from the TiN films formed in various conditions, equivalent electrical performance was attained regardless of the formation conditions of the TiN films. The composition of the TiN film is analyzed, and it is found that an atomic ratio of Ti to nitrogen ranges from 1:1 to 1:1.5. Based on the findings, a nitrogen concentration in the TiN film may be acceptable equal to or larger than that of a Ti, thus the TiN film having the nitrogen concentration of wide range may be used.

A heat treatment is carried out at 800° C. for one minute in an $N_2$ atmosphere to diffuse nitrogen into the entire Mo film 102 from the TiN film 105 through solid phase diffusion. Thus, the Mo film doped with nitrogen therein can be formed (not shown). By considering the diffusion of nitrogen into the Mo film, the heat treatment condition is preferably at a temperature between 800° C. and 900° C. and a time being approximately one minute, and the atmosphere may be available an atmosphere which does not react with the TiN film. An inert gas atmosphere, such as argon (Ar), may be available in addition to nitrogen.

The nitrogen concentration in the Mo film 103 formed by nitrogen diffusion described above was analyzed by the backside SIMS (secondary ion mass spectroscopy). It is resulted that the nitrogen concentration is $2\times10^{21}/cm^3$ at an interface between the Mo film 103 and the $SiO_2$ film 101. The backside SIMS is a method to SIMS-analyze an impurity depth profile in a film formed on a front surface from backside of the film while sputtering to remove its backside, after thinning a substrate from backside by grinding, for example, to a very thin thickness.

Next, a region other than the second semiconductor device region 12 is covered with a resist film (not shown). The TiN film 105 on the second semiconductor device region 12 is removed by dry etching using the resist film as a mask. As etching gas for the dry etching above, for example, chlorine ($Cl_2$) gas or a mixed gas of $Cl_2$ and boron trichloride ($BCl_3$) may be used.

Further, portions of Mo film being formed gate electrodes on the first and second semiconductor device regions 11, 12 are covered with a resist film (not shown). Then, the TiN film 105 on the first semiconductor device region 11 and the Mo film 103 doped with nitrogen on the first and second semiconductor device regions 11, 12 are sequentially etched by anisotropic dry etching using the resist film as a mask. Thus, gate electrode structures 110, 120 are formed as shown in FIG. 3. As the anisotropic dry etching gas, for example, $Cl_2$ or a mixed gas of $Cl_2$ and $BCl_3$ may be used for the TiN film 105 and, for example, a mixed gas of $Cl_2$ and oxygen ($O_2$) may be used for the Mo film 103 doped with nitrogen. As is clearly seen in the drawing, the gate electrode structure 110 on the first semiconductor device region 11 is a three-layered structure including a gate insulator 111, a Mo film 113 doped with nitrogen and a TiN film 115. That is, the upper surface of the Mo film 113 doped with nitrogen is covered with the TiN film 115. On the other hand, the gate electrode structure 120 on the second semiconductor device region 12 is a two-layered structure including a gate insulator 121 and a Mo film 123 doped with nitrogen. That is, the upper surface and side surfaces of the Mo film 123 doped with nitrogen are exposed.

Next, a region other than the first semiconductor device region 11 is covered with a resist film (not shown) to form sources/drains 117 in the first semiconductor device region 11 as shown in FIG. 5. Then, a dopant of the second conductivity type (n type), such as arsenic (As), is implanted with high concentration into the surface region of the silicon substrate 10 in a self-aligned manner using the gate electrode structure 110 as a mask. Thus, implanted layers 117i are formed as shown in FIG. 4. Likewise, in order to form sources/drains 127 in the second semiconductor device region 12, dopant of the first conductivity type (p type), such as boron (B), is implanted with high concentration into the surface region of the silicon substrate 10. Thus, implanted layers 127i are formed.

After that, an SiN film (not shown) is formed on an entire surface of the resultant structure. The first semiconductor device region 11 is only covered with a resist film (not shown), and then the SiN film on a region other than the first semiconductor device region 11 is removed by isotropic dry etching using the resist film as a mask. Next, a region other than the first semiconductor device region 11 is covered with a resist film (not shown), and then an anisotropic dry etching is performed to leave SiN films 118 only on the side surfaces of the gate electrode structure 110 on the first semiconductor device region 11 using the resist film as a mask. As a result, as shown in FIG. 4, the SiN films 118 preventing diffusion of nitrogen can be formed only on the side surfaces of the gate electrode structure 110 on the first semiconductor device region 11. As a nitrogen diffusion preventing film, an $SiO_2$ film or the like may be used in addition to the SiN film. Thus, for the gate electrode structure 110 on the first semiconductor device region 11, the upper surface of the Mo film 113 doped with nitrogen is covered with the TiN film 115 and the side surfaces are covered with the SiN films 118. Therefore, the Mo film 113 doped with nitrogen is not exposed. On the other hand, for the gate electrode structure 120 of the second semiconductor device region 12, none of the upper surface and side surface of the Mo film 123 doped with nitrogen is covered with any films. Thus, the Mo film 123 doped with nitrogen is exposed.

Next, an annealing is performed, for example, at 900° C. for one minute in $N_2$ to the substrate with the structure shown in FIG. 4. The annealing is performed to electrically activate the implanted dopants 117i, 127i to form the sources/drains 117, 127 and recover damage caused by the implantation. Further, during the annealing, nitrogen doped in the Mo film 123 of the gate electrode structure 120 on the second semiconductor device region 12 is out-diffused from its exposed upper and side surfaces. As a result, a Mo film 124 with extremely reduced nitrogen can be formed.

The nitrogen concentration in the Mo film 124 after nitrogen out-diffusion is analyzed by backside SIMS and, it is found that the nitrogen concentration at the interface between the Mo film 124 and the $SiO_2$ film 121 was $1\times10^{21}/cm^3$. That is, the nitrogen concentration in the Mo film 124 can be reduced by a half.

As shown in FIG. 5, the upper surface of the gate electrode structure 110 on the first semiconductor device region 11 is covered with the TiN film 115 and the side surfaces are covered with the SiN films 118. Therefore, nitrogen does not out-diffuse from the Mo film 113 doped with nitrogen, thus the Mo film 113 with high nitrogen concentration may be maintained as doped. For an atmosphere of the annealing, gas hardly reacting with Mo or Ti, for example, nitrogen, argon or the like, may be used. As a result, as shown in FIG. 5, a CMOS structure having an n-type MOS semiconductor device 11n and p-type MOS semiconductor device 12p can be formed.

After that, a process required for forming a MOS semiconductor device, for example, formation of multilevel wiring is performed to complete a CMOS semiconductor device.

As described the detail later, the semiconductor device formed according to the embodiment has different capacitance-voltage (C-V) characteristics on the n-type MOS device 11n and p-type MOS device 12p and it is confirmed that the gate electrodes thereof have different work function values.

As described above, the nitrogen concentrations in the Mo gate electrodes 113, 124 of the n-type MOS device 11n and p-type MOS device 12p can be adjusted by the method according to the second embodiment of the invention. That is, a CMOS semiconductor device having different work function values in the gate electrodes 113, 124 of the n-type and p-type MOS devices 11n, 12p, respectively, is formed.

SECOND EMBODIMENT

A second embodiment relates to a manufacturing method for a CMOS semiconductor device having regions with shallower junction depth formed near gate edges (hereinafter referred to as extensions) to relax the short channel effect of a MOS semiconductor device. Similar to the first embodiment, nitrogen is doped into an entire Mo film before gate electrode patterning and then nitrogen is out-diffused from the gate electrodes of only one of the MOS devices.

Figure 6:
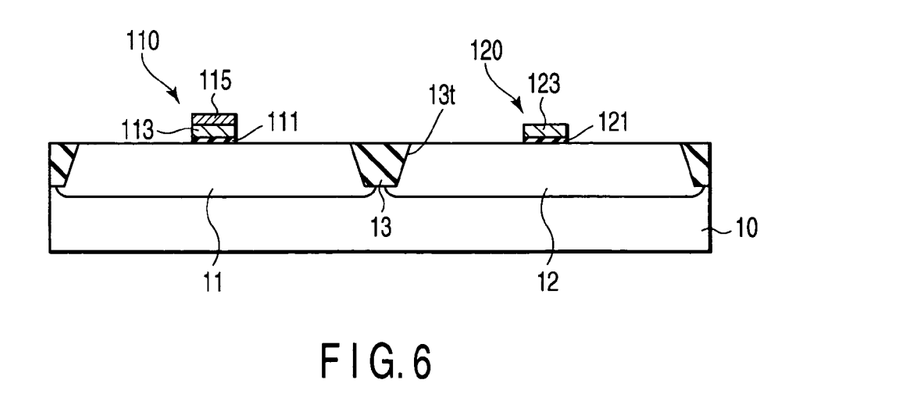
FIG. 6 is a cross sectional view for explaining an example of a MOS semiconductor device manufacturing process according to a second embodiment of the present invention.
Figure 7:
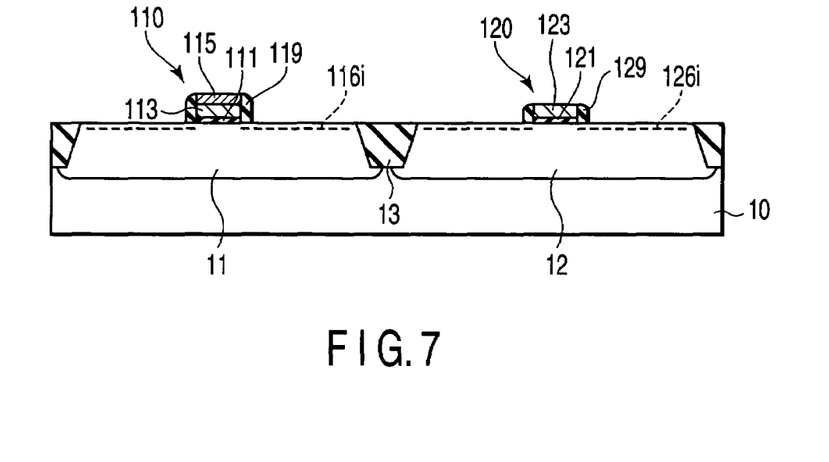
FIG. 7 is a cross sectional view for explaining an example of the MOS semiconductor device manufacturing process according to the second embodiment following FIG. 6.
Figure 8:
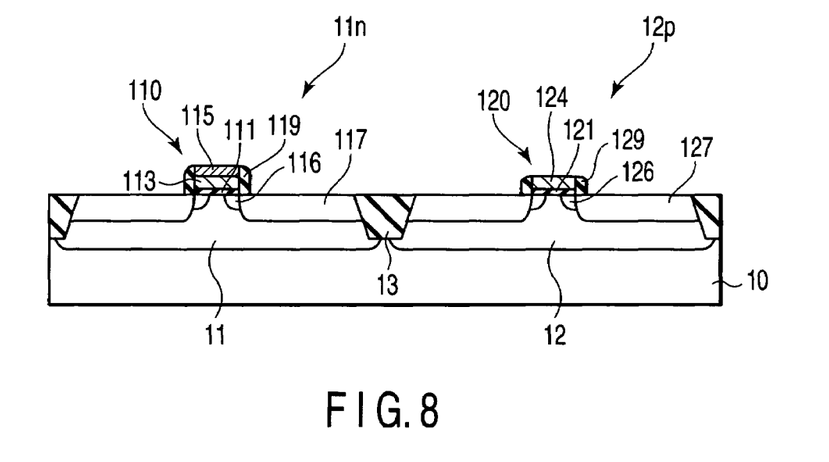
FIG. 8 is a cross sectional view for explaining an example of the MOS semiconductor device manufacturing process according to the second embodiment following FIG. 7.

FIGS. 6 to 8 are cross sectional views showing the steps of a manufacturing method for a MOS semiconductor device according to the second embodiment of the invention. In this embodiment, the process up to the step of forming the gate electrode structures 110, 120 is the same as that of the first embodiment. Therefore, the process up to the gate electrode formation is briefly explained below, but the detail explanation is omitted.

FIG. 6 is the same as FIG. 3. First and second semiconductor device regions 11, 12 and an isolation 13 to isolate adjacent semiconductor devices from each other are formed on a silicon substrate 10. On the first semiconductor device region 11, a three-layered gate electrode structure 110 including a gate insulator 111, a Mo film 113 doped with nitrogen and a TiN film 115 is formed. On the second semiconductor device region 12, a two-layered gate electrode structure 120 including a gate insulator 121 and a Mo film 123 doped with nitrogen is formed. The resultant structure is shown in FIG. 6. As seen clearly in FIG. 6, an upper surface of the Mo film 113 doped with nitrogen in the gate electrode structure 110 on the first semiconductor device region 11 is covered with a TiN film 115. On the other hand, upper and side surfaces of the Mo film 123 doped with nitrogen in the gate electrode structure 120 on the second semiconductor device region 12 are exposed.

In the present embodiment, a silicon thermal oxide film with a thickness of 2 nm is used as a gate insulator 101, a Mo film 102 with a thickness of 50 nm formed by sputtering is used, and a TiN film 105 with a thickness of 30 nm formed by the reactive sputtering is used. And a heat treatment is carried out at 800° C. for one minute in an $N_2$ atmosphere to diffuse nitrogen through solid phase diffusion from the TiN film 105 into the Mo film 102. As dry etching gas used to remove the TiN film 105 on the second semiconductor device region 12, for example, $Cl_2$ or a mixed gas of $Cl_2$ and $BCl_3$ may be used. Further, as anisotropic dry etching gas to form the gate electrode structures 110, 120 on the first and second semiconductor device regions 11, 12, for example, $Cl_2$ or a mixed gas of $Cl_2$ and $BCl_3$ may be used for the TiN film 105 on the first semiconductor device region 11 and, for example, a mixed gas of $Cl_2$ and oxygen ($O_2$) may be used for the Mo film doped with nitrogen on the first and second semiconductor device regions 11, 12.

Next, in order to form extensions 116 in the first semiconductor device region 11 as shown in FIG. 8, a region other than the first semiconductor device region 11 is covered with a resist film (not shown). Then, an n-type dopant of the second conductivity type, such as arsenic, is implanted at a low energy into the surface region of the silicon substrate 10 in a self-aligned manner using the gate electrode 110 as a mask. Thus, implanted layers 116i are formed as shown in FIG. 7. Likewise, in order to form extensions 126 in the second semiconductor device region 12, a p-type dopant of the first conductivity type, such as boron, is implanted at a low energy into the surface region of the silicon substrate 10 to form implanted layers 126i. The implantation for forming extensions is performed at a lower energy and with a lower concentration in comparison with an implantation for forming sources/drains as will be described later.

Next, an SiN film (not shown) is deposited on an entire surface of the resultant structure, then anisotropic dry etching for etching back the SiN film is performed to form SiN films 119, 129 as side wall spacers on the side surfaces of the gate electrode structures 110, 120. As shown in FIG. 7, on the gate electrode structure 110 on the first semiconductor device region 11, the upper surface of the Mo film 113 doped with nitrogen is covered with the TiN film 115 and the side surfaces thereof are covered with the SiN films 119 of the side wall spacers. Therefore, the Mo film 113 doped with nitrogen is not exposed. On the gate electrode structure 120 on the second semiconductor device region 12, though the side surfaces of the Mo film 123 doped with nitrogen are covered with the SiN films 129 of the side wall spacers, the upper surface thereof is not covered with any film and the Mo film 123 is exposed.

Next, in order to form sources/drains 117 in the first semiconductor device region 11 as shown in FIG. 8, a region other than the first semiconductor device region 11 is covered with a resist film (not shown). Then, an n-type dopant of the second conductivity type, such as arsenic, is implanted into the surface region of the silicon substrate 10 in a self-aligned manner with a higher concentration and at a higher energy than those in the implantation for forming the extension 116i using the gate electrode 110 and side wall spacers 119 as masks. Likewise, in order to form sources/drains 127 in the second semiconductor device region 12, a p-type dopant of the first conductivity type, such as boron, is implanted into the surface region of the silicon substrate 10 with a higher concentration and at a higher energy than those in the implantation for forming the extension 126*i*.

Next, an annealing is performed, for example, at 900° C. for one minute in an $N_2$ atmosphere. The annealing is performed to electrically activate the dopants implanted to form the extensions 116, 126 and sources/drains 117, 127 and recover damage caused by the implantations. The extensions 116, 126 thus formed are shallower in junction depth and lower in dopant concentration than those of in the sources/drains 117, 127.

Further, during the annealing, on the second semiconductor device region 12, nitrogen doped in the Mo film 123 of the gate electrode structure 120 is out-diffused from the exposed upper surface of the Mo film 123. As a result, a Mo film 124 with a reduced nitrogen concentration can be formed as shown in FIG. 8.

On the other hand, on the first semiconductor device region 11, the upper surface of the gate electrode structure 110 is covered with the TiN film 115 and the side surfaces thereof are covered with the SiN films 119 of the sidewall spacers. Therefore, nitrogen is not out-diffused from the Mo film 113 doped with nitrogen so that the nitrogen concentration in the Mo film 113 can be remained in high. For an atmosphere of the annealing, a gas hardly reacting with Mo or Ti, for example, nitrogen, argon or the like, may be used. As a result, as shown in FIG. 8, a CMOS structure having an n-type MOS semiconductor device 11*n* and p-type MOS semiconductor device 12*p* may be formed.

After that, a process required for forming a MOS semiconductor device, for example, formation of multilevel wirings is performed to complete a CMOS semiconductor device.

As described above, the nitrogen concentrations in the Mo gate electrodes 113, 124 of the n-type MOS device 11*n* and p-type MOS device 12*p* can be adjusted by the method according to the second embodiment of the invention. That is, a CMOS semiconductor device having different work function values in the gate electrodes 113, 124 of the n-type and p-type MOS devices 11*n*, 12*p*, respectively, is formed.

THIRD EMBODIMENT

Like the first embodiment, a third embodiment relates to a manufacturing method for a CMOS semiconductor device in which no extensions are formed. However, in the third embodiment, nitrogen is doped into both gate electrodes after gate electrode structures are formed and then nitrogen is out-diffused from the gate electrodes of only one of the CMOS devices.

Figure 9:
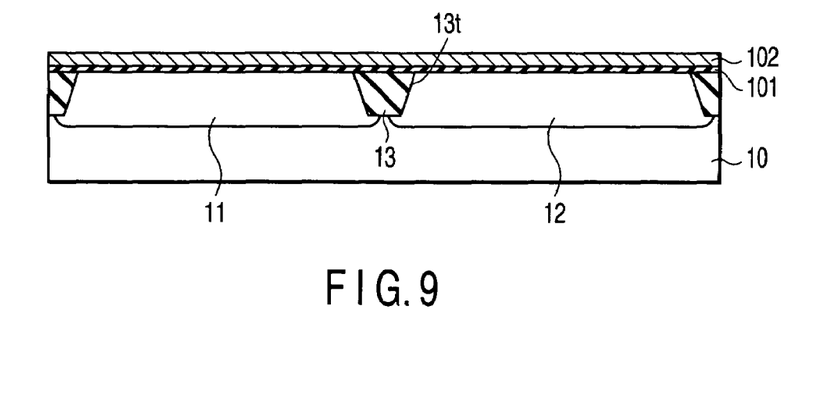
FIG. 9 is a cross sectional view for explaining an example of a MOS semiconductor device manufacturing process according to a third embodiment of the present invention.

FIGS. 9 to 12 are cross sectional views showing the steps of a manufacturing method for a MOS semiconductor device according to the third embodiment of the invention. As shown in FIG. 9, first and second semiconductor device regions 11, 12 and an isolation 13 to isolate the adjacent semiconductor devices from each other are formed on a silicon substrate 10. Further, a gate insulator 101 and a Mo film 102 for forming gate electrodes are formed on an entire surface of the resultant structure. In this embodiment, the process up to the step of forming the Mo film 102 is the same as that of the first embodiment, and therefore, the explanation is omitted.

In this embodiment, a silicon thermal oxide film with a thickness of 2 nm is formed by a thermal oxidation as the gate insulator 101 and a Mo film 102 with a thickness of 50 nm formed by sputtering is used.

Figure 10:
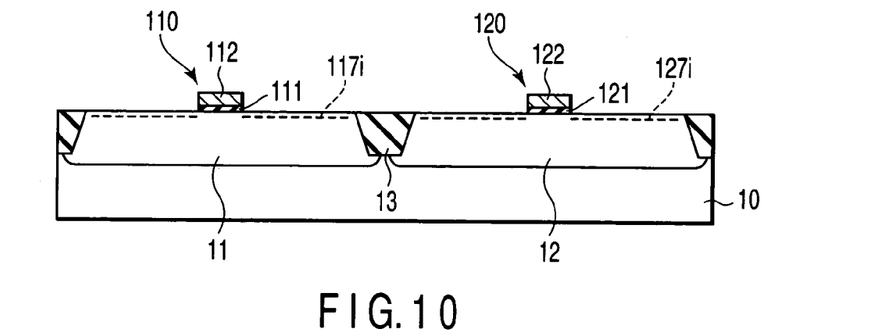
FIG. 10 is a cross sectional view for explaining an example of the MOS semiconductor device manufacturing process according to the third embodiment following FIG. 9.

Next, in order to form gate electrode structures 110, 120 shown in FIG. 10, portions of Mo film 102 being formed gate electrodes on the first and second semiconductor device regions 11, 12 are covered with a resist film (not shown). An etching is performed to the Mo film 102 by anisotropic dry etching using the resist film as a mask. As the anisotropic dry etching gas, for example, a mixed gas of $Cl_2$ and $O_2$ may be used. Each of the gate electrode structures 110, 120 has a two-layered structure including the gate insulator 111 or 121 and the Mo film 112 or 122.

Figure 11:
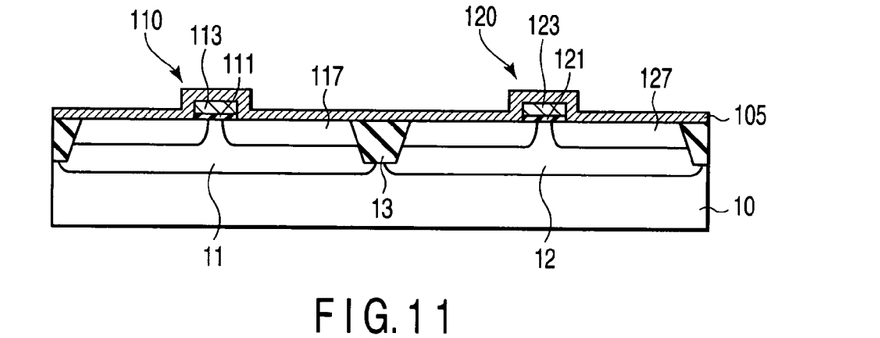
FIG. 11 is a cross sectional view for explaining an example of the MOS semiconductor device manufacturing process according to the third embodiment following FIG. 10.

After that, in order to form sources/drains 117 in the first semiconductor device region 11 as shown in FIG. 11, a region other than the semiconductor device region 11 is covered with a resist film (not shown). Then, an n-type dopant of the second conductivity type, such as arsenic, is implanted in a self-aligned manner with a high impurity concentration into the surface region of the silicon substrate 10 using the gate electrode structure 110 as a mask. Thus, implanted layers 117*i* are formed as shown in FIG. 10. Likewise, in order to form sources/drains 127 in the second semiconductor device region 12, a p-type dopant of the first conductivity type, such as boron, is implanted with a high impurity concentration into the surface region of the silicon substrate 10. Thus, implanted layers 127*i* are formed. As a result, the structure shown in FIG. 10 is formed.

After that, an TiN film 105 is formed on an entire surface of the substrate with the above structure as shown in FIG. 11. The TiN film 105 is used to diffuse nitrogen into the Mo film 112, 122 in the next step. As the TiN film 105 used in this embodiment, a film with 30 nm thick is formed by reactive sputtering. Next, an annealing is performed, for example, at 900° C. for one minute in an $N_2$ atmosphere. The annealing is performed to serve the following two purposes. The first purpose is to electrically activate the dopants implanted to form the sources/drains 117, 127 and recover damage caused by the implantations. The second purpose is to diffuse nitrogen from the TiN film 105 into the Mo films 112, 122 through solid phase diffusion. As a result, the sources/drains 117, 127 and Mo films 113, 123 doped with nitrogen are formed as shown in FIG. 11.

Figure 12:
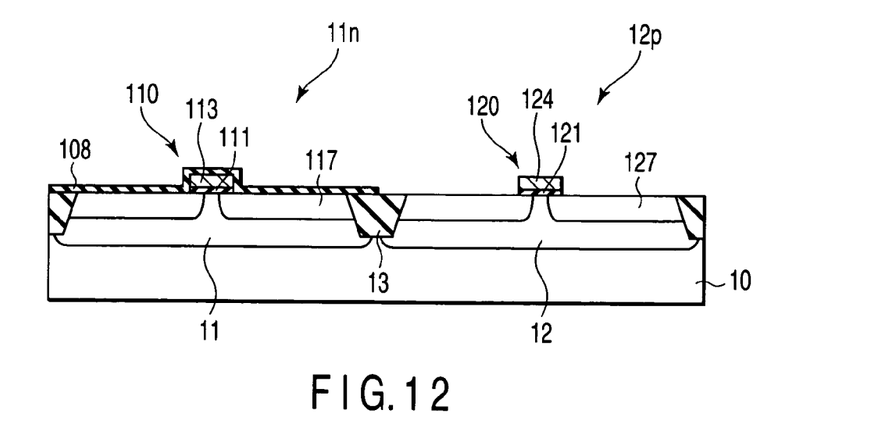
FIG. 12 is a cross sectional view for explaining an example of the MOS semiconductor device manufacturing process according to the third embodiment following FIG. 11.

Next, all of the TiN film is removed by isotropic dry etching. As isotropic dry etching gas, for example, $Cl_2$ or a mixed gas of $Cl_2$ and $BCl_3$ may be used. After that, an SiN film 108 is formed only on the first semiconductor device region 11 to prevent out-diffusion of nitrogen from the Mo film 113 doped with nitrogen, as shown in FIG. 12. That is, an SiN film 108 is formed on an entire surface of the substrate, then only the first semiconductor device region 11 is covered with a resist film (not shown). Then, the SiN film 108 on a region other than the first semiconductor device region 11 is removed by isotropic dry etching using the resist film as a mask. As a result, as shown in FIG. 12, the upper surface and side surfaces of the gate electrode structure 110 on the first semiconductor device region 11 are covered with the SiN film 108 for preventing out-diffusion of nitrogen. On the other hand, none of the upper surface and side surfaces of the gate electrode structure 120 on the second semiconductor device region 12 is covered with a film and, as shown in FIG. 11, the Mo film 123 doped with nitrogen is exposed.

In this state, an annealing is performed to out-diffuse nitrogen from the exposed upper surface and side surfaces of the Mo film 123 doped with nitrogen of the gate electrode structure 120. As a result, the nitrogen concentration in the Mo film 124 in the gate electrode structure 120 is reduced. On the other hand, on the gate electrode structure 110 on the first semiconductor device region 11, the surfaces of the Mo film 113 doped with nitrogen are covered with the SiN film 108 for preventing out-diffusion of nitrogen, so that the nitrogen concentration in the Mo film 113 can be remained in the high concentration. In this embodiment, the annealing is performed at 900° C. for one minute in an N$_2$ atmosphere. For the atmosphere of the annealing, a gas hardly reacting with Mo or Ti, for example, nitrogen, argon or the like, may be used. Then, the SiN film 108 on the sources/drains 117 in the first semiconductor region 11 is removed.

After that, a process required for forming a MOS semiconductor device, for example, formation of multilevel wirings is performed to complete a CMOS semiconductor device.

As described above, the nitrogen concentrations in the Mo gate electrodes 113, 124 of the n-type MOS device 11n and p-type MOS device 12p can be adjusted by the method according to the third embodiment of the invention. That is, a CMOS semiconductor device having different work function values in the gate electrodes 113, 124 of the n-type and p-type MOS devices 11n, 12p, respectively, is formed.

This embodiment may be modified as follows.

The TiN film 105 shown in FIG. 11 may be removed from the second semiconductor device region 12 after the TiN film 105 is formed. That is, the first semiconductor device region 11 is covered with a resist film (not shown), then the TiN film 105 (including the TiN films on the side surfaces of the gate electrode structure 120) on the second semiconductor device region 12 is removed by isotropic dry etching using the resist film as a mask. As etching gas, for example, Cl$_2$ or a mixed gas of Cl$_2$ and BCl$_3$ may be used. After that, an annealing is performed at 900° C. for one minute in an N$_2$ atmosphere, for example. One of the purposes of the annealing is to electrically activate the dopants implanted to form the sources/drains 117, 127 shown in FIG. 11 and recover damage caused by the implantations. Another purpose is to diffuse nitrogen from the TiN film 105 only into the Mo film 112 of the gate electrode structure 110 on the first semiconductor device region 11 shown in FIG. 10 to form a Mo film 113 doped with nitrogen. Thus, the Mo gate electrode 113 doped with nitrogen is formed on the first semiconductor device region 11, the Mo gate electrode 122 without doping nitrogen is formed on the second semiconductor device region 12, and the sources/drains 117, 127 are formed.

After the annealing, the TiN film 105 left only on the first semiconductor device region 11 is removed by isotropic dry etching. As etching gas, for example, Cl$_2$ or a mixed gas of Cl$_2$ and BCl$_3$ may be used.

After that, a process required for forming a MOS semiconductor device, for example, formation of multilevel wirings is performed to complete a CMOS semiconductor device.

With the method of the modification, the following process may be omitted and the process may be simplified in comparison with that of the third embodiment. That is, it is possible to omit both of the steps of forming a film 108 to prevent out-diffusion of nitrogen from the Mo film 113 doped with nitrogen of the gate electrode structure 110 on the first semiconductor device region 11, and annealing to out-diffuse nitrogen from the Mo gate electrode doped with nitrogen on the second semiconductor device region 12.

As described above, the nitrogen concentrations in the Mo gate electrodes 113, 122 of the n-type MOS semiconductor device 11n and p-type MOS semiconductor device 12p can be adjusted by the method according to the modification of the third embodiment. That is, a CMOS semiconductor device having different work function values in the gate electrodes 113, 122 of n-type and p-type MOS devices 11n, 12p, respectively, is formed.

FOURTH EMBODIMENT

Like the second embodiment, a fourth embodiment relates to a manufacturing method for a CMOS semiconductor device having extensions formed near gate edges to relax a short channel effect of a MOS semiconductor device. Further, like the third embodiment, the fourth embodiment relates to a case wherein nitrogen is doped into both of the gate electrodes after the gate electrode structures are formed and then nitrogen is out-diffused only from the gate electrodes one of the CMOS devices.

Figure 13:
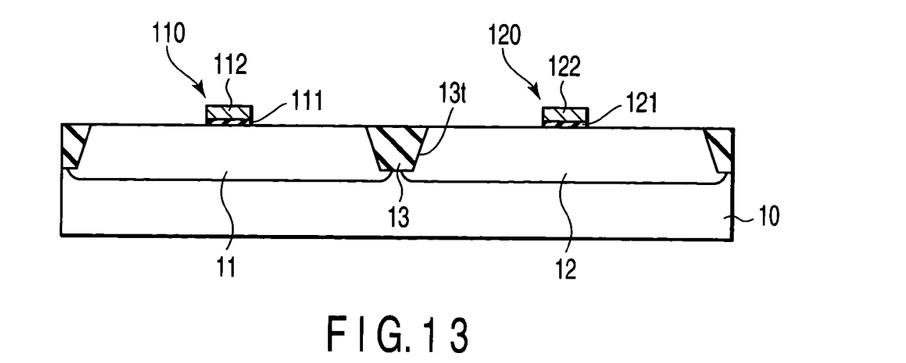
FIG. 13 is a cross sectional view for explaining an example of a MOS semiconductor device manufacturing process according to a fourth embodiment of the present invention.
Figure 14:
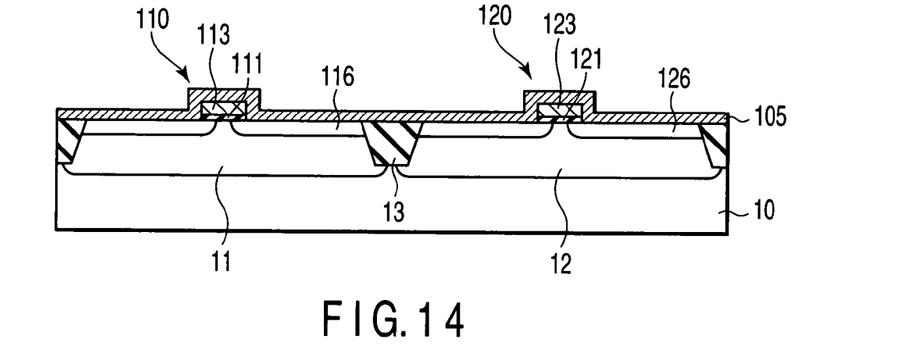
FIG. 14 is a cross sectional view for explaining an example of the MOS semiconductor device manufacturing process according to the fourth embodiment following FIG. 13.
Figure 15:
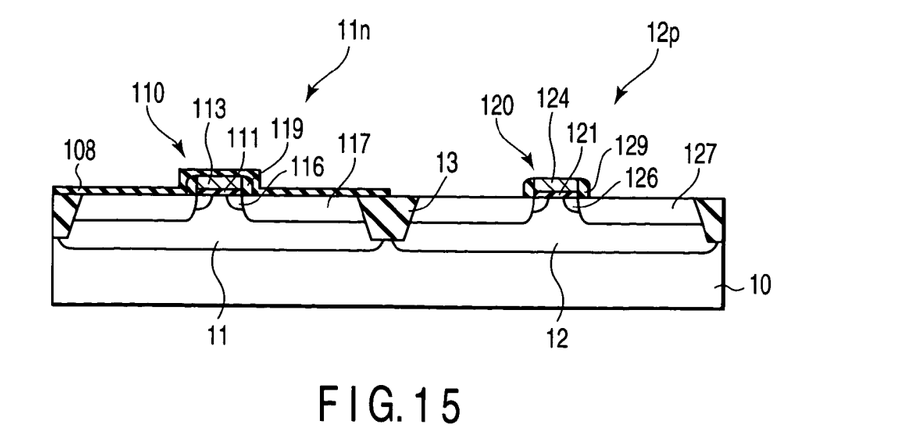
FIG. 15 is a cross sectional view for explaining an example of the MOS semiconductor device manufacturing process according to the fourth embodiment following FIG. 14.

FIGS. 13 to 15 are cross sectional views showing the steps of a manufacturing method for a MOS semiconductor device according to the fourth embodiment of the invention. In this embodiment, the process up to the step of forming the gate electrode structures is the same as that of the third embodiment, and therefore, the detail explanation for the process up to the gate electrode structure forming step is omitted.

As shown in FIG. 13, first and second semiconductor device regions 11, 12 and an isolation 13 to isolate the adjacent semiconductor devices from each other are formed in a silicon substrate 10. Like the case of FIG. 9, a gate insulator 101 and a Mo film 102 for forming gate electrodes are formed on the resultant structure. Then, gate electrode structures having a two-layered structure including gate insulators 111, 121 and Mo films 112, 122 are formed on the first and second semiconductor device regions 11, 12 by anisotropic dry etching.

In this embodiment, a silicon thermal oxide film with a thickness of 2 nm is formed as the gate insulator 101 and a Mo film 102 with a thickness of 50 nm is formed by sputtering. Further, as the anisotropic dry etching gas for the Mo film 102, for example, a mixed gas of Cl$_2$ and O$_2$ may be used to form the gate electrode structures 110, 120 on the first and second semiconductor device regions 11, 12.

Next, in order to form extensions 116 in the first semiconductor device region 11 as shown in FIG. 14, a region other than the first semiconductor device region 11 is covered with a resist film (not shown). Then, an n-type dopant of second conductivity type, such as arsenic, is implanted at a low energy into a surface of the silicon substrate 10 in a self-aligned manner using the gate electrode 110 as a mask so that to form implanted layers (not shown). Likewise, in order to form extensions 126 in the second semiconductor device region 12, a p-type dopant of first conductivity type, such as boron, is implanted at a low energy into the surface region of the silicon substrate 10 to form implanted layers (not shown). The implantation for forming extension is performed at a lower energy and with a lower concentration in comparison with the implantation for forming sources/drains as will be described later.

Next, a TiN film 105 is formed on an entire surface of the substrate with the above structure as shown in FIG. 14. The TiN film 105 is used to diffuse nitrogen into the Mo films 112, 122 in the next step. The TiN film 105 with 30 nm thick formed by the reactive sputtering is used in this embodiment. After that, an annealing is performed, for example, at 900° C. for one minute in an N$_2$ atmosphere. The annealing is performed to serve the following two purposes. The first purpose is to electrically activate the dopants implanted to form the extensions 116, 126 and recover damage caused by the implantations. The second purpose is to dope nitrogen into the Mo films 112, 122 from the TiN film 105. As a result, the extensions 116, 126 and Mo films 113, 123 doped with nitrogen are formed as shown in FIG. 14.

Next, all of the TiN film 105 is removed by isotropic dry etching. As etching gas, for example, Cl$_2$ or a mixed gas of Cl₂ and BCl₃ may be used. After that, an SiN film (not shown) is deposited by CVD on an entire surface of the substrate of the resultant structure. Then, the SiN film is etched back by anisotropic dry etching. As a result, SiN films 119, 129 are formed as sidewall spacers on the side surfaces of the gate electrode structures 110, 120 as shown in FIG. 15.

Next, a region other than the first semiconductor device region 11 is covered with a resist film (not shown) to form sources/drains 117 in the first semiconductor device region 11 as shown in FIG. 15. Then, an n-type dopant of the second conductivity type, such as arsenic, is implanted in a self-aligned manner at a higher energy and with a high concentration into the surface region of the silicon substrate 10 than those in the implantations for forming the extensions 116i using the gate electrode structure 110 and side wall spacers 119 as a mask. Likewise, in order to form sources/drains 127 in the second semiconductor device region 12, a p-type dopant of the first conductivity type, such as boron, is implanted into the surface region of the silicon substrate 10 at a higher energy with a higher concentration than those in the implantation for forming the extensions 126i.

After that, an SiN film 108 to prevent out-diffusion of nitrogen from the Mo film 113 doped with nitrogen is formed only on the first semiconductor device region 11. That is, the SiN film 108 is formed on an entire surface of the substrate, then only the first semiconductor device region 11 is covered with a resist film (not shown) and the SiN film 108 on a region other than the first semiconductor device region 11 is removed by isotropic dry etching using the resist film as a mask. As a result, as shown in FIG. 15, the upper surface of the gate electrode 120 of the second semiconductor device region 12 is not covered with the film and the Mo film 123 doped with nitrogen is exposed. The upper surface and side surfaces of the gate electrode 110 of the first semiconductor device region 11 are covered with the SiN films 108, 119 to prevent diffusion of nitrogen.

Next, an annealing is performed, for example, at 900° C. for one minute in an N₂ atmosphere. The annealing is performed to electrically activate the dopants implanted to form sources/drains 117, 127 and recover damage caused by the implantation. The sources/drains 117, 127 thus formed have deeper junction depth and higher dopant concentration than those of the extensions 116, 126.

Further, during the annealing, in the gate electrode structure 120 on the second semiconductor device region 12, the upper surface of the Mo film 123 doped with nitrogen is exposed, while the side surfaces are covered with the sidewall spacers 129. Therefore, nitrogen doped in the Mo film 123 is out-diffused from the exposed upper surface and a Mo film 124 having reduced nitrogen concentration can be formed. On the other hand, on the gate electrode structure 110 on the first semiconductor device region 11, since the upper surface and side surfaces of the Mo film 113 doped with nitrogen are covered with the SiN films 108, 119 to prevent diffusion of nitrogen during the annealing, the nitrogen concentration in the Mo film 113 doped with nitrogen can be remained in high. As atmospheric gas used in the annealing, gas which is difficult to react with Mo may be used and, for example, N₂, Ar or the like may be used. As a result, as shown in FIG. 15, a CMOS structure having an n-type MOS semiconductor device 11n and p-type MOS semiconductor device 12p can be formed. Then, the SiN film 108 on the sources/drains 117 in the first semiconductor region 11 is removed.

After that, a process required for forming a MOS semiconductor device, for example, formation of multilevel wirings is performed to complete a CMOS semiconductor device.

As described above, the nitrogen concentrations in the Mo gate electrodes 113, 124 of the n-type MOS semiconductor device 11n and p-type MOS semiconductor device 12p can be adjusted by the method according to the fourth embodiment of the invention. That is, a CMOS semiconductor device having different work function values in the gate electrodes 113, 124 of n-type and p-type MOS devices 11n, 12p, respectively, is formed.

This embodiment may be modified as follows.

After the gate electrodes are formed as shown in FIG. 13, an implantation for forming the extensions 116, 126 shown in FIG. 14 and a process for forming the TiN film 105 are performed in the same manner as in the fourth embodiment. After that, the process may be modified to remove the TiN film 105 formed on the second semiconductor device region 12. That is, the first semiconductor device region 11 is covered with a resist film (not shown) and the TiN film 105 formed on the second semiconductor device region 12 (including the TiN film on the side surfaces of the gate electrode structure 120) is removed by isotropic dry etching using the resist film as a mask. As etching gas for the isotropic dry etching, for example, Cl₂ or a mixed gas of Cl₂ and BCl₃ may be used. After that, an annealing is performed at 900° C. for one minute in an N₂ atmosphere. The annealing is performed to serve the following two purposes. The first purpose is to electrically activate dopants implanted to form the extensions 116, 126 and recover damage caused by the implantation. The second purpose is to diffuse nitrogen from the TiN film 105 into the Mo film 112 of the gate electrode structure 110 on the first semiconductor device region 11. As a result, the extensions 116, 126 are formed, and nitrogen is diffused into the Mo film 112 of the gate electrode structure 110 on the first semiconductor device region 11 to form a Mo film 113 doped with nitrogen. A Mo film 122 without doping nitrogen is formed on the gate electrode structure 120 on the second semiconductor device region 12.

After that, the same process as that of the third embodiment is performed to complete a MOS semiconductor device. The process is roughly explained below. After the annealing, the TiN film 105 left only on the first semiconductor device region 11 is removed by isotropic dry etching. As etching gas, for example, Cl₂ or a mixed gas of Cl₂ and BCl₃ may be used. After that, side wall spacers 119, 129 of SiN films are formed on the side walls of the gate electrode structures 110, 120 on the first and second semiconductor device regions 11, 12. Then, implantations are performed with a high dopant concentration to form sources/drains 117, 127 in the first and second semiconductor device regions 11, 12. Next, an SiN film 108 for preventing out-diffusion of nitrogen is formed on the upper surface of the gate electrode structure 110 on the first semiconductor device region 11. Then, an annealing is performed to electrically activate the dopant implanted to form the sources/drains 117, 127 and recover damage caused by the implantation. While, in the annealing, the nitrogen concentration in the Mo film 113 can be remained high, since the surfaces of the Mo film 113 doped with nitrogen of the gate electrode structure 110 are covered with the SiN films 108, 119.

After that, a process required for forming a MOS semiconductor device, for example, formation of multilevel wirings is performed to complete a CMOS semiconductor device.

As described above, the nitrogen concentrations in the Mo gate electrodes 113, 122 of the n-type MOS semiconductor device 11n and p-type MOS semiconductor device 12p can be adjusted by the method according to the modification of the fourth embodiment. That is, a CMOS semiconductor device having different work function values in the gate electrodes 113, 122 of n-type and p-type MOS semiconductor devices 11n, 12p, respectively, is formed.

Figure 16:
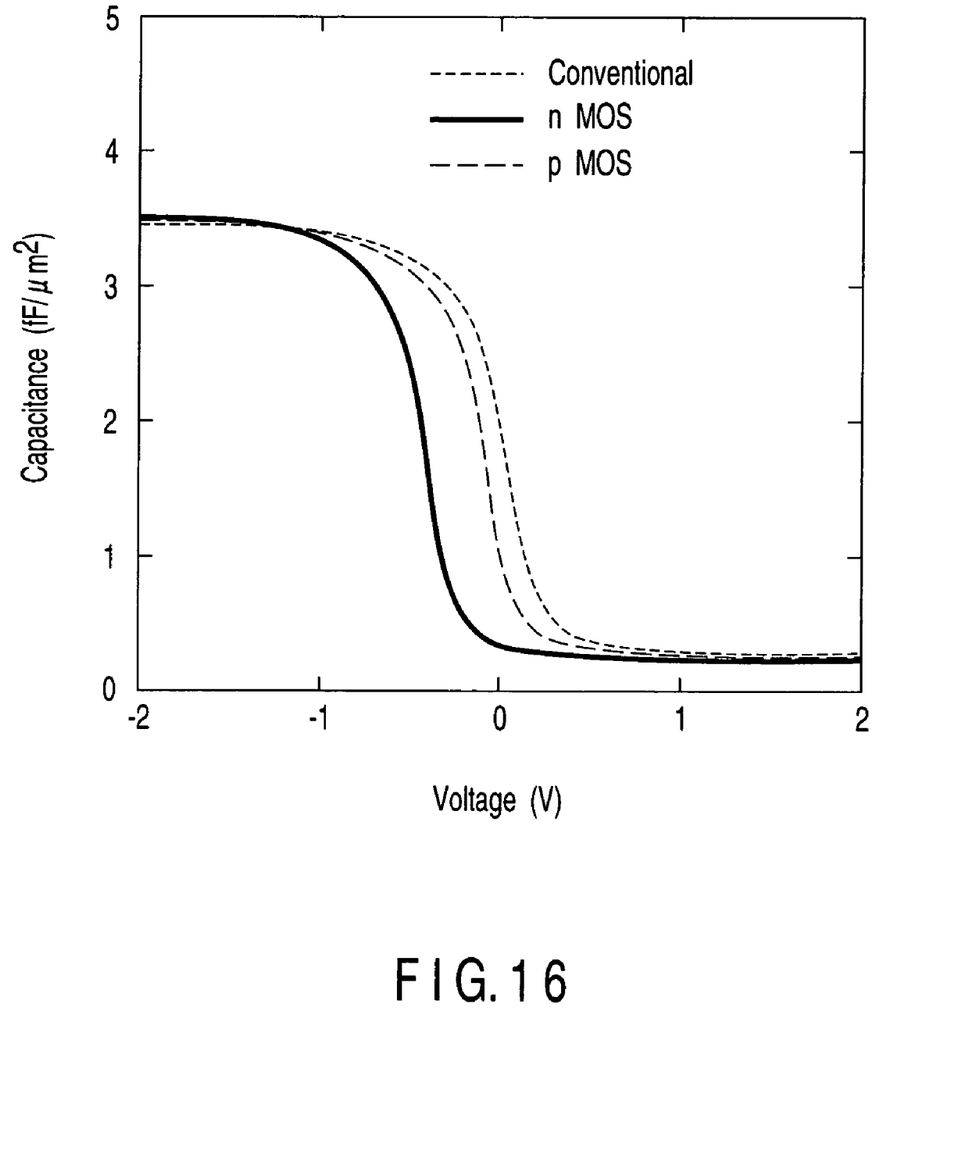
FIG. 16 shows a capacitance-voltage (C-V) characteristic showing the effect of the present invention.

FIG. 16 shows capacitance-voltage (C-V) characteristics of CMOS capacitors formed by a process as in the first embodiment in order to prove effects of the invention. In this case, a thermal oxide film of 10 nm thick is used as a gate insulator. In FIG. 16, a solid line shows a characteristic of an nMOS capacitor corresponding to an n-type MOS semiconductor device in which the Mo film of the gate electrode is doped with nitrogen at a high concentration. A broken line shows a characteristic of a pMOS capacitor corresponding to a p-type MOS semiconductor device in which nitrogen is out-diffused from the Mo film doped with nitrogen of the gate electrode to reduce the nitrogen therein. Further, as a reference, a dotted line shows a characteristic of a conventional capacitor using a Mo film without doping nitrogen as a gate electrode. The effect provided by doping nitrogen into the Mo film of the gate electrode can be proved by comparing the characteristics indicated by the solid line and dotted line. It is proved that, by doping nitrogen into the Mo film of the gate electrode by the method of the invention, the C-V characteristic of the nMOS capacitor indicated by the solid line is shifted by approximately −0.5 V with respect to that of the conventional MOS capacitor indicated by the dotted line. That is, the work function of Mo gate is shifted by approximately −0.5 eV by doping nitrogen into the Mo film of the gate electrode. Further, the effect provided by out-diffusing nitrogen from the Mo film of the gate electrode can be proved by comparing the characteristics indicated by the solid line and broken line. By out-diffusing nitrogen from the Mo film of the gate electrode by the method of the invention, it can be confirmed that the C-V characteristic of the pMOS capacitor indicated by the broken line is shifted by approximately +0.4 V with respect to that of the nMOS capacitor indicated by the solid line and is recovered to be sufficiently closer to that of the conventional MOS capacitor indicated by the dotted line, which is a characteristic of the MOS capacitor without doping nitrogen in Mo film. That is, the work function of Mo is shifted by approximately +0.4 eV by out-diffusing nitrogen from the Mo film of the gate electrode. In other words, the effect of nitrogen remained in the Mo film to the work function is only −0.1 eV. Therefore, it is proved that a CMOS semiconductor device having different work function values in the gate electrodes for the n-type and p-type MOS semiconductor devices can be formed by the method of the invention.

As described above, the nitrogen concentrations in the Mo gate electrodes of the n-type and p-type MOS semiconductor devices can be adjusted by the method of the invention. That is, a CMOS semiconductor device having different work function values in the gate electrodes of the n-type and p-type MOS semiconductor devices, respectively, can be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS semiconductor device comprising:
a first and a second MOS semiconductor element device, each of the first and the second MOS semiconductor element devices having a gate electrode including a molybdenum film containing nitrogen, wherein a nitrogen concentration of the first MOS semiconductor element device is different from the nitrogen concentration of the second MOS semiconductor element device; and
wherein a work function of the gate electrode of each of the first and the second MOS semiconductor element devices is different from each other; and
wherein the gate electrode of exactly one of the first and the second MOS semiconductor element devices further comprises a titanium nitride film formed on the molybdenum film.

2. The MOS semiconductor device according to claim 1, wherein the titanium nitride film has a composition in which the ratio of titanium to nitrogen ranges from 1:1 to 1:1.5.

* * * * *